(12) United States Patent
Tae et al.

(10) Patent No.: US 9,818,768 B2
(45) Date of Patent: Nov. 14, 2017

(54) ARRAY SUBSTRATE FOR DISPLAY DEVICE

(71) Applicant: Samsung Display Co., Ltd., Yongin (KR)

(72) Inventors: Chang-Il Tae, Seoul (KR); Jun Seok Lee, Seoul (KR); Do Yeong Park, Seoul (KR); Seung Ho Yang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/730,947

(22) Filed: Jun. 4, 2015

(65) Prior Publication Data

US 2016/0190160 A1    Jun. 30, 2016

(30) Foreign Application Priority Data

Dec. 26, 2014    (KR) .................. 10-2014-0190441

(51) Int. Cl.

| H01L 27/14 | (2006.01) |
|---|---|
| H01L 29/04 | (2006.01) |
| H01L 29/15 | (2006.01) |
| H01L 31/036 | (2006.01) |
| H01L 27/12 | (2006.01) |
| G02F 1/1362 | (2006.01) |

(52) U.S. Cl.
CPC ...... *H01L 27/124* (2013.01); *G02F 1/136209* (2013.01); *H01L 27/1248* (2013.01); *G02F 2001/136218* (2013.01); *G02F 2001/136222* (2013.01); *G02F 2201/40* (2013.01)

(58) Field of Classification Search
CPC ............... H01L 27/124; H01L 27/1259; H01L 27/1248; G02F 1/1368; G02F 1/134309; G02F 1/13439; G02F 2001/136222; G02F 1/1335; G02F 1/133509; G02F 1/133512; G02F 1/133514
See application file for complete search history.

(56) References Cited

U.S. PATENT DOCUMENTS

| 7,477,345 B2 | 1/2009 | Kim et al. |
| 2004/0195573 A1* | 10/2004 | Kim .................. G02F 1/136227 257/72 |
| 2009/0225017 A1* | 9/2009 | Kim .................. G02F 1/133514 345/88 |
| 2009/0251631 A1* | 10/2009 | Kim .................. G02F 1/133514 349/48 |
| 2011/0216261 A1 | 9/2011 | Han et al. |

(Continued)

FOREIGN PATENT DOCUMENTS

| KR | 10-2005-0096367 | 10/2005 |
| KR | 10-2007-0004329 | 1/2007 |
| KR | 10-2008-0047832 | 5/2008 |

*Primary Examiner* — Thanh Y Tran
(74) *Attorney, Agent, or Firm* — H.C. Park & Associates, PLC

(57) ABSTRACT

The array substrate for display device includes: a substrate; a signal line disposed on the substrate; a first color filter disposed on one side of the signal line; a second color filter disposed on the other side of the signal line; and an overlapping portion disposed to overlap part of the first color filter and part of the second color filter. The first color filter extends to overlap the signal line and the overlapping portion is disposed on the other side of the signal line so as not to overlap the signal line.

9 Claims, 11 Drawing Sheets

(56) References Cited

U.S. PATENT DOCUMENTS

| | | | |
|---|---|---|---|
| 2011/0216276 A1* | 9/2011 | Yang | G02F 1/1335 349/108 |
| 2011/0242468 A1* | 10/2011 | Choi | C08G 8/12 349/129 |
| 2013/0057813 A1* | 3/2013 | Jeong | G02F 1/134309 349/110 |
| 2013/0101755 A1* | 4/2013 | Lee | G02F 1/133707 428/1.23 |
| 2015/0185567 A1* | 7/2015 | Lee | H01L 27/1248 349/44 |

* cited by examiner

1000

ARRAY SUBSTRATE FOR DISPLAY DEVICE

CROSS REFERENCE TO RELATED APPLICATION

This application claims priority from and the benefit of Korean Patent Application No. 10-2014-0190441, filed on Dec. 26, 2014, which is hereby incorporated by reference for all purposes as if fully set forth herein.

BACKGROUND

Field

Exemplary embodiments relate to an array substrate for a display device.

Discussion of the Background

The importance of display devices has steadily grown with recent developments in multimedia technology. As a result, a variety of display devices such as a liquid crystal display (LCD) device, an organic electroluminescent display device, and the like have been developed and have become widespread.

An LCD device is a type of display device that typically may obtain an image signal by applying an electric field to a liquid crystal material. The liquid crystal material may have anisotropic dielectric characteristics and may be disposed between two substrates. In a typical LCD device, adjusting the intensity of the electric field may control the amount of light provided by an external light source transmitted through the two substrates.

During the manufacture of a typical LCD device, the liquid crystal material may be applied in a liquid phase onto a display substrate. However, in a case when the surface of an array substrate for a display device is uneven, the liquid crystal material may not be evenly spread, and may thus cause the display quality of a display device to deteriorate. Accordingly, a method is needed to prevent the display quality of a display device from deteriorating due to an unevenly distributed liquid crystal material.

SUMMARY

Exemplary embodiments of the present invention provide an array substrate for a display device. The array substrate is formed to have an even surface and can thus secure a liquid crystal margin.

Additional features of the invention will be set forth in the description which follows, and in part will be apparent from the description, or may be learned by practice of the invention.

An exemplary embodiment discloses an array substrate for a display device. The array substrate for display device includes: a substrate; a signal line disposed on the substrate; a first color filter disposed on one side of the signal line; a second color filter disposed on the other side of the signal line; and an overlapping portion disposed to overlap part of the first color filter and part of the second color filter. The first color filter extends to overlap the signal line and the overlapping portion is disposed on the other side of the signal line so as not to overlap the signal line.

An exemplary embodiment also discloses an array substrate for a display device. The array substrate for display device includes: a substrate; a signal line disposed on the substrate; a first color filter disposed on one side of the signal line; a second color filter disposed on the other side of the signal line; and an overlapping portion disposed to overlap part of the first color filter and part of the second color filter. The first color filter extends to overlap the signal line, the second color filter extends to overlap part of the signal line and the overlapping portion is disposed in such a manner that part of the overlapping portion overlaps part of the signal line.

An exemplary embodiment also discloses an array substrate for a display device. The array substrate for display device includes: a substrate; a signal line disposed on the substrate and including a plurality of first sub-signal lines and a plurality of second sub-signal lines that are alternately arranged; a first color filter disposed on one side of the signal line; a second color filter disposed on the other side of the signal line; and an overlapping portion disposed to overlap part of the first color filter and part of the second color filter. The first color filter extends to overlap all the first sub-signal lines and at least some of the second sub-signal lines, the second color filter extends to overlap at least some of the second sub-signal lines, and the overlapping portion is disposed on the other side of the second sub-signal lines to overlap the first sub-signal lines, but not to overlap the second sub-signal lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the inventive concept, and together with the description serve to explain the principles of the invention.

DETAILED DESCRIPTION OF THE ILLUSTRATED EMBODIMENTS

Figure 1:
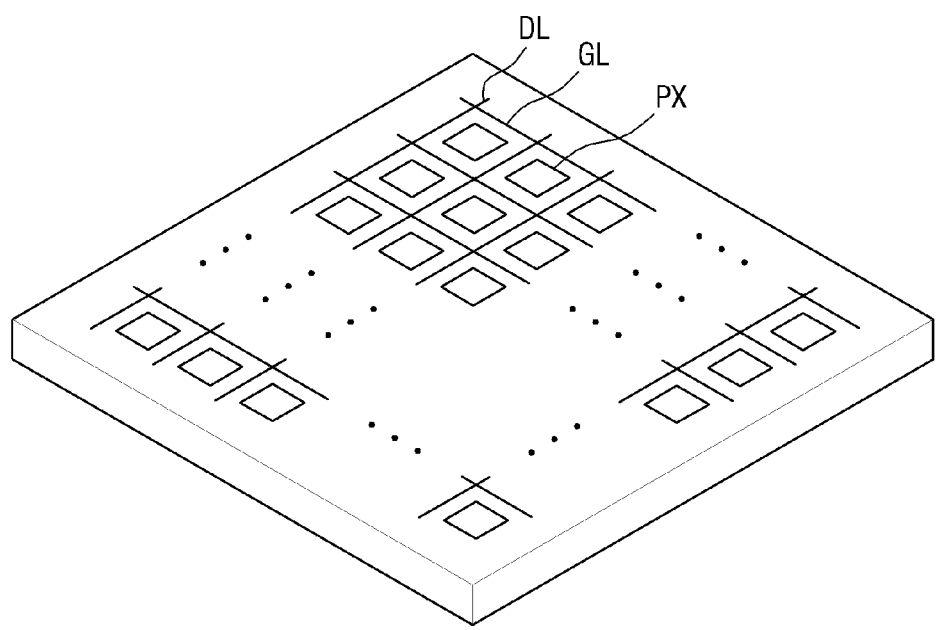
FIG. 1 is a perspective view of an array substrate for a display device, according to an exemplary embodiment.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a perspective view of an array substrate for a display device, according to an exemplary embodiment.

Referring to FIG. 1, an array substrate 1000 may include a plurality of data lines DL, a plurality of gate lines GL, and a plurality of pixels PX.

The gate lines GL may be spaced apart from one another by a predetermined distance, may be arranged in rows, and may transmit a gate signal. The data lines DL may be spaced apart from one another by a predetermined distance, may be arranged in columns, and may transmit a data signal. Gate lines GL and data lines DL may be referred to as signal lines. The gate lines GL and the data lines DL may be arranged in a matrix, and the pixels PX may be disposed at the intersections between the gate lines GL and the data lines DL, as shown in FIG. 1. The gate signal and the data signal may be generated and provided by an external source, and may have various voltage levels.

Each of the pixels PX may display one of a plurality of primary colors, and the primary colors may include a red color, a green color and a blue color. Pixels PX displaying a red color, pixels PX displaying a green color and pixels PX displaying a blue color may be referred to as red pixels, green pixels and blue pixels, respectively, and a group of three pixels PX displaying a red color, a green color and a blue color, respectively, may be referred to as an upper pixel (not illustrated). A red pixel, a green pixels and a blue pixel may be arranged in a row direction or a column direction, or may be arranged to form a triangle. The pixels PX may be arranged in various manners, other than those set forth herein. For example, a pixel PX may display a white color, and/or the pixels may be arranged differently.

Figure 2:
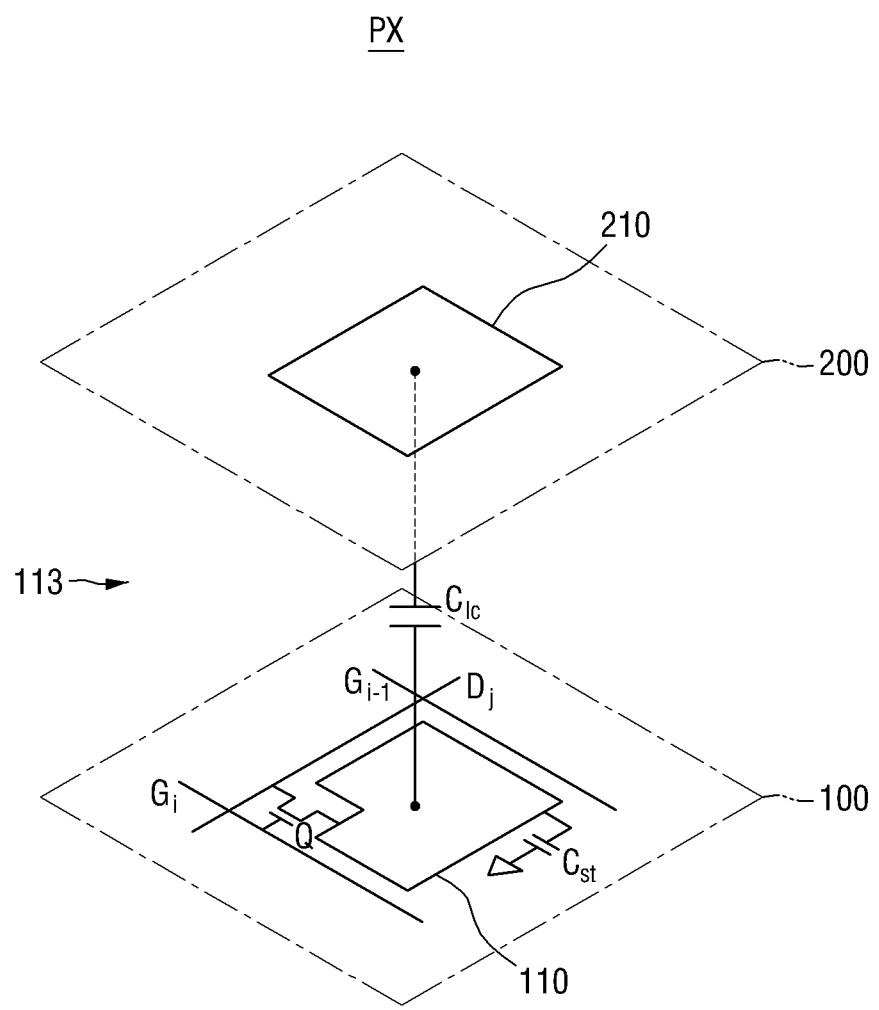
FIG. 2 is a circuit diagram of a pixel according to an exemplary embodiment.

FIG. 2 is a circuit diagram of a pixel PX according to an exemplary embodiment.

Referring to FIG. 2, the pixel PX may include an upper substrate 200, a lower substrate 100, and a liquid crystal layer 113 filling the gap between the upper substrate 200 and the lower substrate 100. The pixel PX may also include a switching element Q, which is connected to a gate line $G_i$ and a data line $D_j$, and the switching element Q may be connected to a pixel electrode 110.

The pixel electrode 110 may form a liquid crystal capacitor $C_{lc}$ together with a common electrode 210, which is disposed on the upper substrate 200, and may include a storage capacitor $C_{st}$. The storage capacitor $C_{st}$ may be optional.

The switching element Q may be a tri-terminal element, such as a thin-film transistor (TFT), which is provided on the lower substrate 100, and may have a control terminal connected to the gate line $G_i$, an input terminal connected to the data line $D_j$, and an output terminal connected to the liquid crystal capacitor $C_{lc}$ and the storage capacitor $C_{st}$.

The liquid crystal capacitor $C_{lc}$ may have the pixel electrode 110 of the lower substrate 100 and the common electrode 210 of the upper substrate 200 as two terminals thereof. The liquid crystal layer 113, which is disposed between the pixel electrode 110 and the common electrode 210, may serve as a dielectric element. The pixel electrode 110 may be connected to the switching element Q. The common electrode 210 may be formed on the entire surface of the upper substrate 200 and may be provided with a common voltage Vcom. The arrangement and the structures of the common electrode 210 and the pixel electrode 110 are not limited to those illustrated in FIG. 2, and at least one of the pixel electrode 110 and the common electrode 210 may be formed in a linear or bar shape.

The storage capacitor $C_{st}$, which performs an auxiliary role to the liquid crystal capacitor $C_{lc}$, may be formed by an overlap between a signal line (not illustrated) provided on the lower substrate 100 and the pixel electrode 110 with a dielectric element interposed therebetween. A voltage, such as the common voltage Vcom, may be provided to the signal line. However, the configuration of the storage capacitor $C_{st}$ is not limited thereto. For example, the storage capacitor $C_{st}$ may be formed by an overlap between the pixel electrode 110 and a gate line $G_{i-1}$ with a dielectric element interposed therebetween.

As described above with reference to FIG. 1, the pixel PX may display one of a plurality of primary colors. To display a color, a color filter (not illustrated) may be provided between the upper substrate 200 and the lower substrate 100, which will hereinafter be described with reference to FIG. 3.

Figure 3:
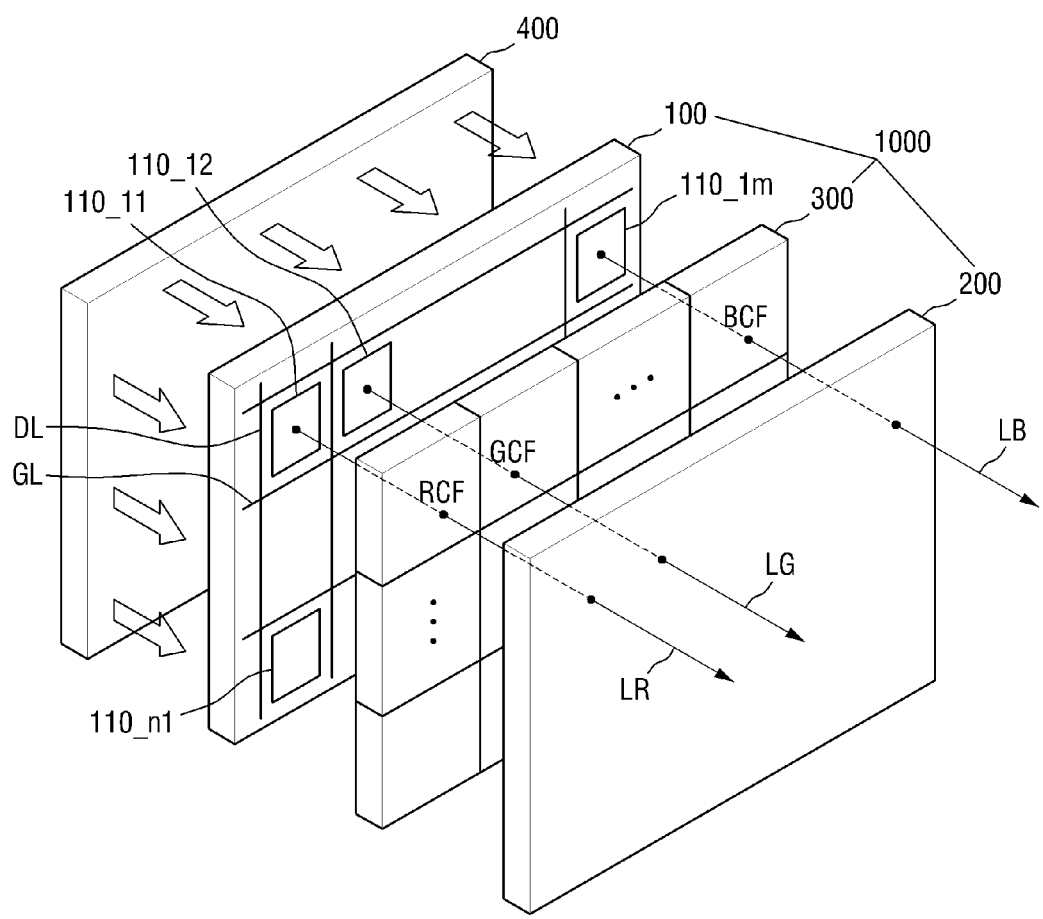
FIG. 3 is an exploded perspective view of an array substrate and a backlight unit for a display device according to an exemplary embodiment.

FIG. 3 is an exploded perspective view of the array substrate and a backlight unit for a display device according to an exemplary embodiment.

Referring to FIG. 3, the array substrate 1000 may include a color filter layer 300, which is disposed between the upper substrate 200 and the lower substrate 100. A display device including the array substrate 1000 may also include a backlight unit 400, which is provided at the rear of the array substrate 1000.

The backlight unit 400 may emit white light with various wavelength components. The structure and shape of the backlight unit 400 are not limited to those illustrated in FIG. 3. Various types of light sources such as cold cathode fluorescent lamps (CCFLs), organic light-emitting diodes (OLEDs), or the like may be used to form the backlight unit 400. Any type of light source that can form a backlight unit may be utilized. Thus, a detailed description of the backlight unit 400 will be omitted.

The color filter layer 300 may include a plurality of color filters (RCF, GCF, and BCF), and may transmit therethrough beams of a predetermined wavelength range, among other beams emitted from the backlight unit 400, so as for each of the pixels PX to display a predetermined color.

Each color filter of pairs of adjacent color filters of the color filter layer 300 may correspond to a different color. The color filters of the color filter layer 300 may be arranged in a matrix form, as illustrated in FIG. 3, but the invention is not limited thereto. That is, the color filters of the color filter layer 300 may be formed in various shapes and arrangements, other than those set forth herein or illustrated in FIG. 3.

In the illustrated exemplary embodiment, the color filters of the color filter layer 300 may be arranged to face a direction in which light emitted from the backlight unit 400 travels through a plurality of pixel electrodes 110, and thus may allow regions for different pixel electrodes 110 to render different colors. However, the invention is not limited to this exemplary embodiment. For example, a single color filter may be provided to correspond to the pixels PX, or a plurality of color filters may be provided to correspond to a single pixel PX.

More specifically, first light LR, which is incident upon a first pixel electrode 110 in a first pixel electrode row, i.e., a pixel electrode 110_11, may be transformed into light with a large quantity of red wavelength components by being passed through a red color filter RCF corresponding to the pixel electrode 110_11, and may be viewed by a user of the display device including the array substrate 1000 as red light through the upper substrate 200.

Second light LG, which is incident upon a second pixel electrode 110 in the first pixel electrode row, i.e., a pixel electrode 110_12, may be transformed into light with a large quantity of green wavelength components by being passed through a green color filter GCF corresponding to the pixel electrode 110_12, and may be viewed by the user as green light through the upper substrate 200.

Third light LB, which is incident upon an m-th pixel electrode 110 in the first pixel electrode row, i.e., a pixel electrode 110_1$m$, may be transformed into light with a large quantity of blue wavelength components by being passed through a blue color filter BCF corresponding to the pixel electrode 110_1$m$, and may be viewed by the user as blue light through the upper substrate 200.

The color filters of the color filter layer 300 are illustrated in FIG. 3 as being in a rectangular shape, but the invention is not limited thereto. That is, the color filters of the color filter layer 300 may be formed in various shapes other than a rectangular shape. Also, the boundaries between the color filters of the color filter layer 300 may be straight lines, as illustrated in FIG. 3, or may be curved lines. Also, a pair of adjacent color filters may be formed to partially overlap each other.

Figure 4:
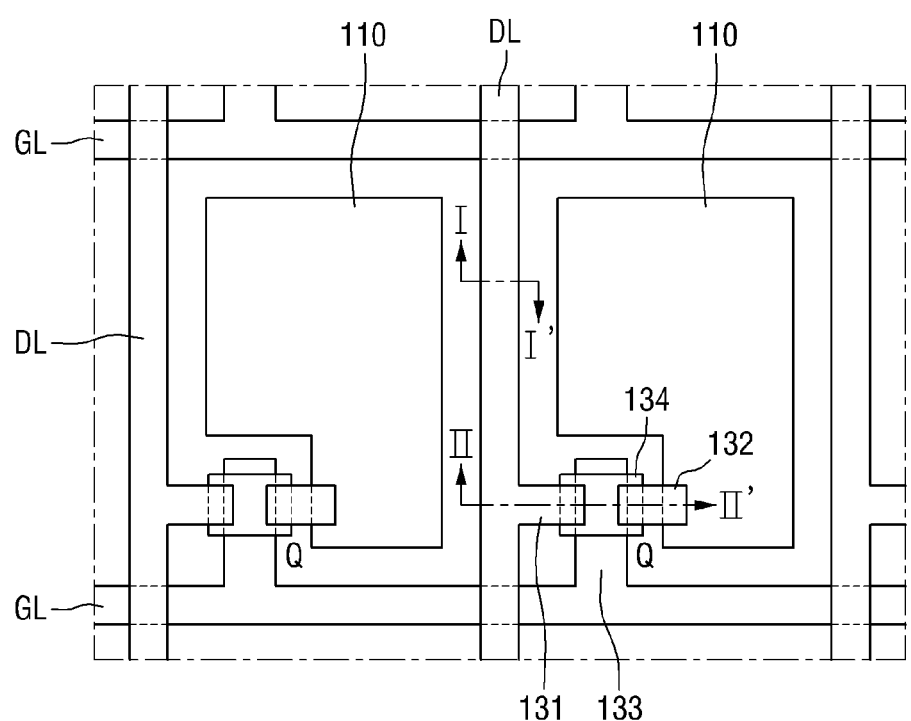
FIG. 4 is a plan view of an array substrate according to an exemplary embodiment.

FIG. 4 is a plan view of the array substrate according to an exemplary embodiment.

Referring to FIG. 4, the array substrate 1000 may include the data lines DL, which are provided on the lower substrate 100 (as shown in FIG. 3) and extend in a first direction, the gate lines GL, which are provided on the lower substrate 100 and extend in a second direction, a plurality of switching elements Q, which are electrically connected to the data lines DL and the gate lines GL, and a plurality of pixel electrodes 110, which are connected to the switching elements Q.

The lower substrate 100 may be formed of a transparent insulating material, the data lines DL may include a plurality of data electrodes 131, and the gate lines GL may include a plurality of gate electrodes 133. The switching elements Q may be implemented as TFTs. More specifically, each of the switching elements Q may have a source terminal corresponding to one of the data electrodes 131, a control terminal corresponding to one of the gate electrodes 133, and a drain terminal corresponding to one of a plurality of drain electrodes 132, which are connected to the pixel electrodes 110, and may include a semiconductor layer 134, which electrically connects the data electrodes 131 and the drain electrodes 132 according to a voltage provided to the gate electrodes 133.

The color filter layer 300, the common electrode 210 and the upper substrate 200 may be disposed above the data lines DL, the gate lines GL, the switching elements Q and the pixel electrodes 110 of FIG. 4, which will be described in detail with reference to FIG. 5.

Figure 5:
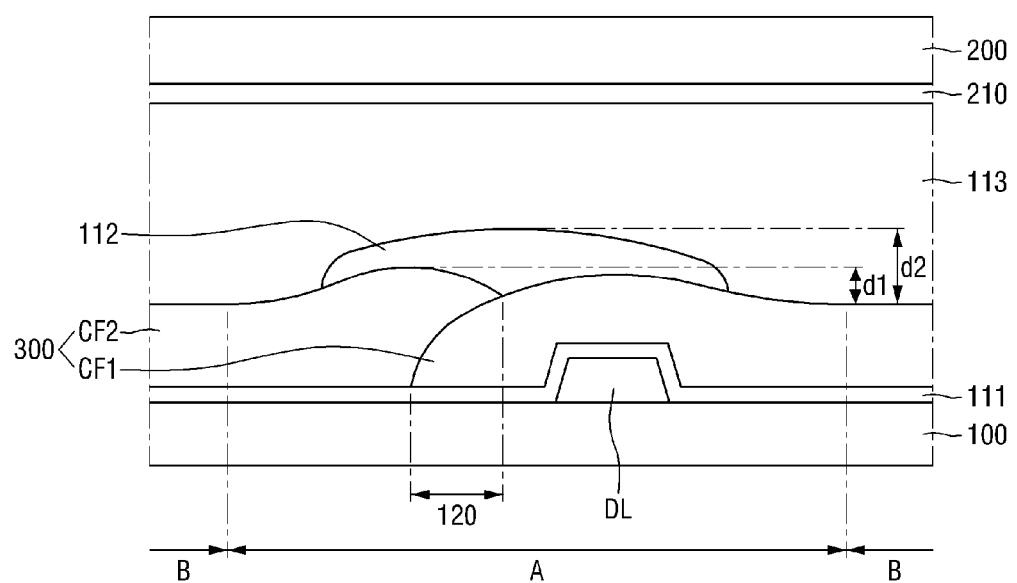
FIG. 5 is a cross-sectional view, taken along line I-I' of FIG. 4, of an array substrate according to an exemplary embodiment.

FIG. 5 is a cross-sectional view, taken along line I-I' of FIG. 4, of the array substrate according to an exemplary embodiment of the invention.

Referring to FIG. 5, a data line DL may be formed on the lower substrate 100. An insulating layer 111 may be formed on the data line DL and on part of the lower substrate 100 where the data line DL is not provided. The insulating layer 111 may be a silicon oxide layer, a silicon nitride layer, or a double layer thereof, but the invention is not limited thereto. That is, the insulating layer 111 may be formed of various materials other than those set forth herein.

A color filter layer 300 including a plurality of color filters may be formed on the insulating layer 111, and the plurality of color filters may include a first color filter CF1 and a second color filter CF2, as illustrated in FIG. 5. The first color filter CF1 and the second color filter CF2 may transmit beams of different wavelength bands therethrough and may thus allow the beams to render different colors. The arrangement of the first color filter CF1 and the second color filter CF2 will be described later in detail.

A shield electrode 112 may be formed on the color filter layer 300. The shield electrode 112 may prevent the pixel electrode 110, which is adjacent to the data line DL and the gate line GL, from being coupled in response to a variation in the voltage of a signal provided via the data line DL or the gate line. For example, in a case when the voltage applied to the data line DL or the gate line is varied, lateral capacitance may be generated between the data line DL or the gate line and the pixel electrode, and may thus kick back and lower the level of a voltage that the pixel electrode is charged with. The shield electrode 112 may be disposed between a pair of adjacent lateral capacitors, i.e., between the data line DL or the gate line and the pixel electrode, and may eliminate the lateral capacitance.

The liquid crystal layer 113 may be formed on the shield electrode 112. The liquid crystal layer 113 may include liquid crystal molecules, and the alignment of the liquid crystal molecules may be controlled by an electric field formed through the liquid crystal layer 113. The amount of light transmitted through the liquid crystal layer 113 may be controlled by the alignment of the liquid crystal molecules. Thus, a color may be displayed as a result of the interaction between the color filter layer 300 and the liquid crystal layer 113.

The common electrode 210 may be formed on the liquid crystal layer 113. The common electrode 210 may interact with the pixel electrode and may thus form a liquid crystal capacitor ($C_{lc}$ of FIG. 2) so as to control the liquid crystal molecules.

The upper substrate 200 may be formed on the common electrode 210 of a transparent material that can transmit light therethrough.

The same direct current (DC) voltage as that applied to the common electrode 210 may be applied to the shield electrode 112 so as not to apply an electric field to the liquid crystal molecules. In a case when no particular electric field is applied to the liquid crystal molecules by applying the same voltage to the shield electrode 112 and the common electrode 210, the liquid crystal molecules cannot transmit light therethrough, and may thus be viewed from above the upper substrate 200 as black. Accordingly, the shield electrode 112 and the elements disposed therebelow may be prevented from being viewed by the user due to the reflection of light. Also, since the shield electrode 112 is formed to overlap an overlapping portion 120 (i.e. a portion in which the first color filter CF1 and second color filter CF2 overlap), a color mixing phenomenon, which is caused by an overlap between the first color filter CF1 and the second color filter CF2, may be prevented from being viewed.

The first color filter CF1 may be disposed on one side of the data line DL, and the second color filter CF2 may be disposed on the other side of the data line DL. More specifically, referring to FIG. 5, the first color filter CF1 may be disposed on the right side of the data line DL, and the second color filter CF2 may be disposed on the left side of the data line DL. The first color filter CF1 may be formed to extend from one side to the other side of the data line DL and thus to overlap the data line DL.

The overlapping portion 120 may be formed in an area where the first color filter CF1 and the second color filter CF2 contact, and partially overlap, each other.

The overlapping portion 120 may be defined as a region between the edges of the first color filter CF1 and the second color filter CF2 that penetrate the farthest into each other. The overlapping portion 120 may be formed not to overlap the data line DL.

The arrangement of the overlapping portion 120 not to overlap the data line DL, will hereinafter be described in further detail. The overlapping portion 120 may be disposed not overlap the data line DL. In response to the overlapping portion 120 being formed not to overlap the data line DL, the color filter layer 300 may be formed to have a gentle slope. In response to the shield electrode 112 being disposed on the color filter layer 300, the shield electrode 112 may also be formed with a gentle slope on the color filter layer 300 because the slope formed by the color filter layer 300 does not include a slope formed by the thickness of the data line DL. The arrangement of the overlapping portion 120 will hereinafter be described in further detail with reference to FIG. 5 and further reference to FIG. 6.

Figure 6:
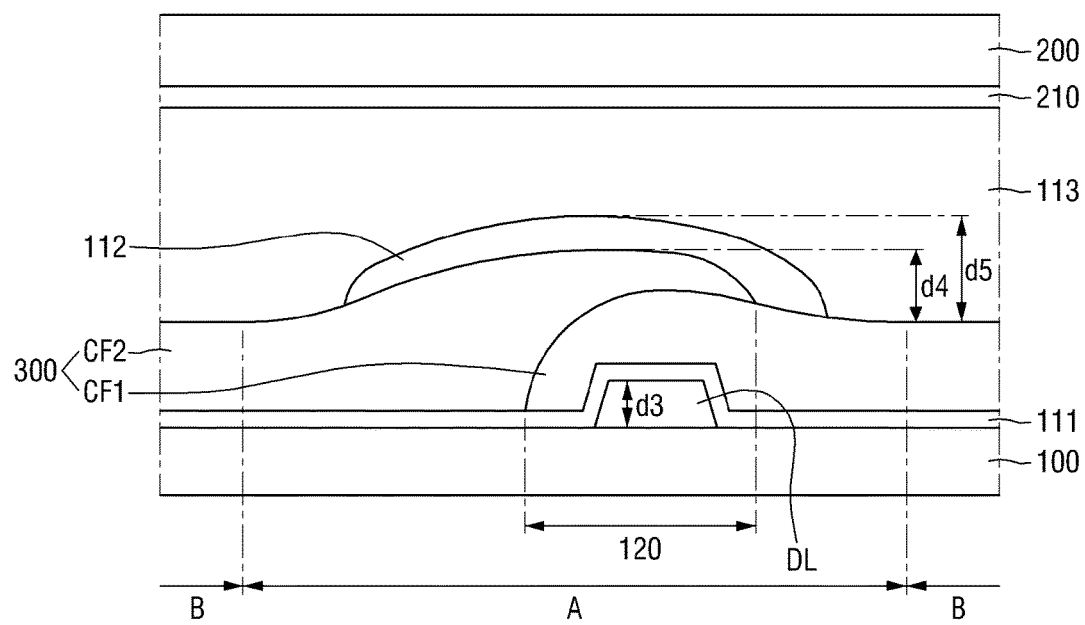
FIG. 6 is a cross-sectional view, taken long line I-I' of FIG. 4, of an array substrate according to a comparative example.

FIG. 6 is a cross-sectional view, taken long line I-I' of FIG. 4, of an array substrate according to a comparative example.

The array substrate of FIG. 6 is almost the same as the array substrate 1000 of FIG. 5, and thus will hereinafter be described, focusing mainly on differences with the array substrate 1000 of FIG. 5.

Referring to FIG. 6, an overlapping portion 120 may be formed to overlap a data line DL. In area A, a first color filter CF1 and a second color filter CF2 overlap each other, and the data line DL is disposed below a color filter layer 300. Accordingly, area A may correspond to a region where the color filter layer 300 has a slope, rather than having a uniform thickness, and area B may correspond to a region where the color filter layer 300 has a uniform thickness.

The maximum difference between the heights of the color filter layer 300 in area A and area B, respectively, may be d4. In a case when a shield electrode 112 is formed on the color filter layer 300, the maximum difference between the heights of the color filter layer 300 and the shield electrode 112 may be d5.

On the other hand, in the array substrate 1000 according to an exemplary embodiment, and as shown in FIG. 5, the maximum difference between the heights of the color filter layer 300 in area A and area B, respectively, may be d1. In a case when the shield electrode 112 is formed on the color filter layer 300, the maximum difference between the heights of the color filter layer 300 and the shield electrode 112 may be d2.

The maximum height differences d1 and d2 may differ from the maximum height differences d4 and d5, respectively, by as much as the thickness of the data line DL, i.e., d3. That is, in the array substrate 1000, the overlapping portion 120 is formed not to overlap the data line DL, and thus, the color filter layer 300 may be prevented, or at least suppressed, from being unevenly formed due to the presence of the data line DL. More specifically, the maximum height difference d4 may be greater than the maximum height difference d1 by as much as d3, and the maximum height difference d5 may be greater than the maximum height difference d2 by as much as d3. However, the difference between the maximum height differences d1 and d4 or the difference between the maximum height differences d4 and d5 may not necessarily be the same as the thickness of the data line DL, and may vary within a predetermined error range due to the interactions among the data line DL, the shield electrode 112 and the color filter layer 300.

During the manufacture of the array substrate 1000, the liquid crystal layer 113 may be formed by applying a liquid crystal molecule. The liquid crystal material is not applied in units of liquid crystal molecules thereof, but applied in larger units than the units of liquid crystal molecules. Once applied, the liquid crystal molecules may be diffused, thereby forming the liquid crystal layer 113. However, if the color filter layer 300 and the shield electrode 112 are formed with a steep slope, as is the case in the comparative example shown in FIG. 6, and thus fail to provide an even surface, the liquid crystal molecules may not be able to be properly diffused, thereby adversely affecting the manufacture of the array substrate 1000 and the display capabilities of the array substrate 1000 and a display device including the array substrate 1000.

Figure 7:
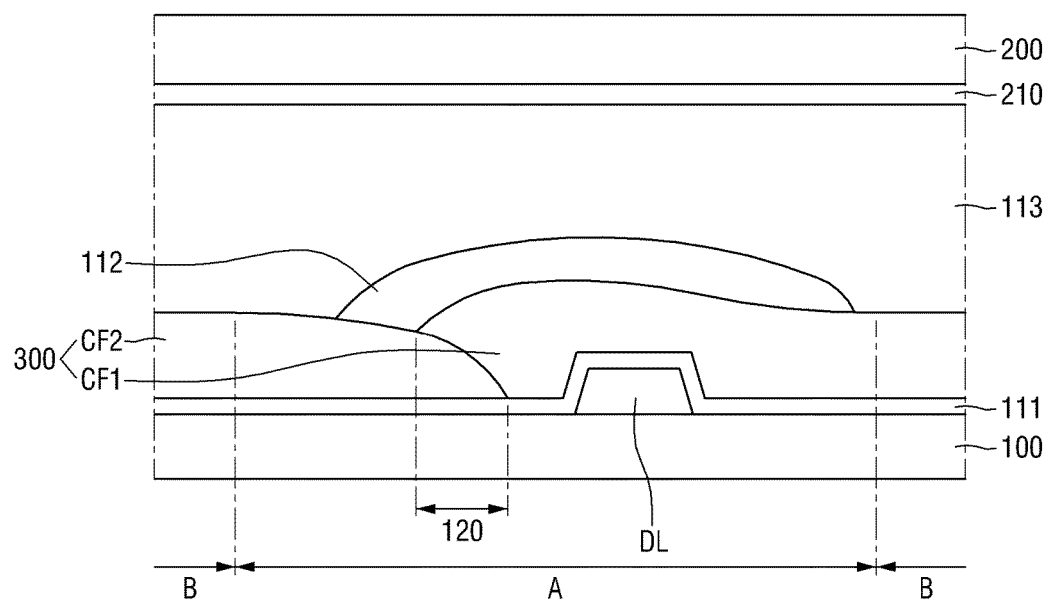
FIG. 7 is a cross-sectional view, taken along line I-I' of FIG. 4, of an array substrate for a display device, according to another exemplary embodiment.

FIG. 7 is a cross-sectional view, taken along line I-I' of FIG. 4, of an array substrate for a display device, according to another exemplary embodiment.

The array substrate according to another exemplary embodiment is almost the same as the array substrate 1000 of FIG. 5, and thus will hereinafter be described, focusing mainly on differences with the array substrate 1000 of FIG. 5.

Referring to FIG. 7, a first color filter CF1 and a second color filter CF2, which overlap each other in an overlapping portion 120, may be formed in such a manner that the second color filter CF2 may penetrate into a lower portion of the first color filter CF1, as opposed to the first color filter CF1 and the second color filter CF2 of FIG. 5, which are formed in such a manner that the first color filter CF1 may penetrate into a lower portion of the second color filter CF2. The overlapping structure of the first color filter CF1 and the second color filter CF2 of FIG. 5 and the overlapping structure of the first color filter CF1 and the second color filter CF2 of FIG. 7 may be selectively used, or may both be used, in an array substrate for a display device.

Figure 8:
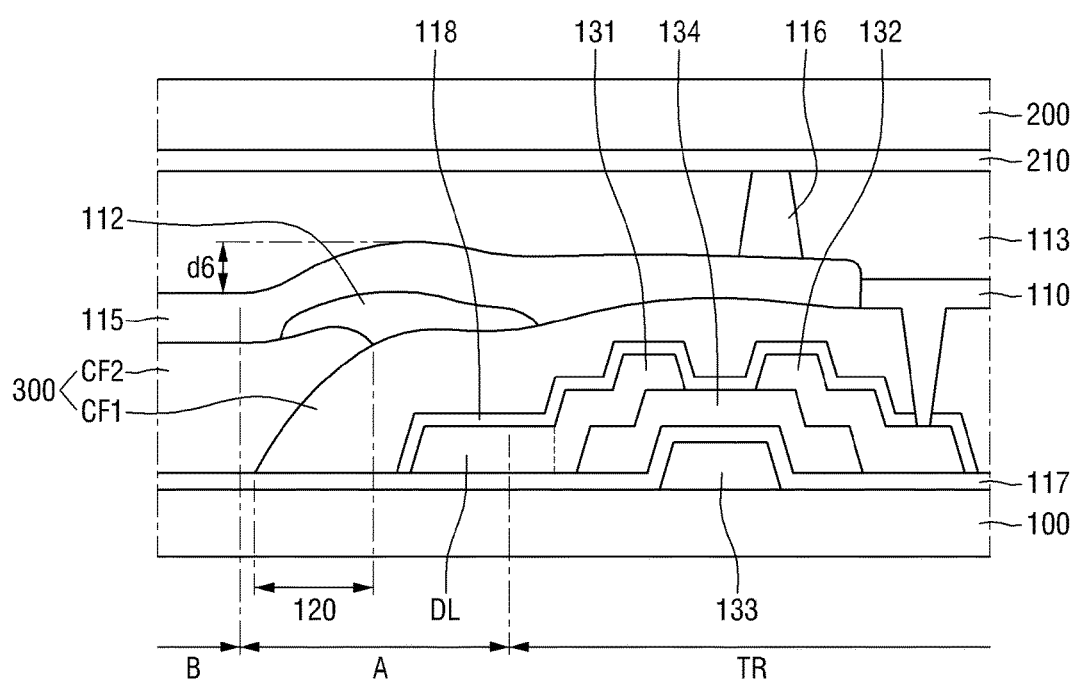
FIG. 8 is a cross-sectional view, taken along line II-II' of FIG. 4, of an array substrate according to an exemplary embodiment.

FIG. 8 is a cross-sectional view, taken along line II-II' of FIG. 4, of the array substrate according to an exemplary embodiment.

Referring to FIG. 8, a switching element Q (as shown in FIG. 4) may be formed on the lower substrate 100. In an exemplary embodiment, the switching element Q may be implemented as a TFT, as illustrated in FIG. 8.

More specifically, the gate line GL including gate electrode 133 may be formed on the lower substrate 100. A first insulating layer 117 may be formed on the gate line. The first insulating layer 117 may be a silicon oxide layer, a silicon nitride layer, or a double layer thereof, but the invention is not limited thereto. That is, the first insulating layer 117 may be formed of various materials other than those set forth herein.

A semiconductor layer 134 may be formed on the first insulating layer 117. The semiconductor layer 134 may allow or block the transmission of a current flowing therein according to a voltage provided via the gate line.

A data electrode 131 and a drain electrode 132 may be formed on the semiconductor layer 134. The data electrode 131 may extend from a data line DL, and may provide a data signal provided via the data line to the semiconductor layer 134. An ohmic contact layer (not illustrated) may be formed between the data electrode 131 and the semiconductor layer 134 to increase consistency during the transmission of the data signal. The drain electrode 132 may be connected to the semiconductor layer 134 at one side thereof, and may be connected to a pixel electrode 110 at the other side thereof to provide the data signal to the pixel electrode 110 via the semiconductor layer 134. An ohmic contact layer (not illustrated) may also be formed between the drain electrode 132 and the semiconductor layer 134 increase consistency during the transmission of the data signal.

A second insulating layer 118 may be formed on the data line DL, the data electrode 131, the semiconductor layer 134 and the drain electrode 132. The second insulating layer 118 may be a silicon oxide layer, a silicon nitride layer, or a double layer thereof, but the invention is not limited thereto. That is, the second insulating layer 118 may be formed of various materials other than those set forth herein. The second insulating layer 118 may be optional.

The color filter layer 300 including the plurality of color filters may be formed on the switching element, and the plurality of color filters may include the first color filter CF1 and the second color filter CF2, as illustrated in FIG. 8. The first color filter CF1 and the second color filter CF2 may transmit beams of different wavelength bands therethrough and may thus allow the beams to render different colors. The arrangement of the first color filter CF1 and the second color filter CF2 will be described later in detail.

The shield electrode 112 may be formed on the color filter layer 300. The shield electrode 112 has already been described above with reference to FIG. 4, and thus, a detailed description thereof will be omitted.

A black matrix 115 may be formed on the shield electrode 112. The black matrix 115 may block light. Due to the presence of the black matrix 115, the reflection of light by various wiring of the array substrate 1000 may be prevented, and as a result, the wiring of the array substrate 1000 may be prevented from being seen from above the array substrate 1000. The black matrix 115 may be arranged to overlap the wiring of the array substrate 1000 to prevent color mixing and properly block light.

A column spacer 116 may be formed on the black matrix 115. The column spacer 116 may separate one pixel PX from another pixel PX formed on the array substrate 1000, and may support the upper substrate 200.

The black matrix 115 may be formed of the same material as the column spacer 116. That is, in an exemplary embodiment, the black spacer 115 and the column spacer 116 may be formed at the same time using the same material and a two-tone mask. In this exemplary embodiment, the column spacer 116 may be formed as being a protrusion of the black matrix 115, but the invention is not limited thereto. That is, the black matrix 115 and the column spacer 116 may be formed in various methods other than that set forth herein.

The liquid crystal layer 113 may be formed on the black matrix 115. The liquid crystal layer 113 may include liquid crystal molecules, and the alignment of the liquid crystal molecules may be controlled by an electric field formed through the liquid crystal layer 113. The amount of light transmitted through the liquid crystal layer 113 may be controlled by the alignment of the liquid crystal molecules. As already mentioned above, a color may be displayed as a result of the interaction among the liquid crystal layer 113, the first color filter CF1 and the second color filter CF2.

The common electrode 210 may be formed on the liquid crystal layer 113. As already mentioned above, the common electrode 210 may interact with the pixel electrode and may thus form a liquid crystal capacitor ($C_{lc}$ of FIG. 2) so as to control the liquid crystal molecules.

The upper substrate 200 may be formed on the common electrode 210 of a transparent material that can transmit light therethrough.

The first color filter CF1 may be disposed on one side of the data line DL, and the second color filter CF2 may be disposed on the other side of the data line DL. More specifically, referring to FIG. 8, the first color filter CF1 may be disposed on the right side of the data line DL, and the second color filter CF2 may be disposed on the left side of the data line DL. The first color filter CF1 may be formed to extend from one side to the other side of the data line DL and thus to overlap the data line DL.

The overlapping portion 120 may be formed in an area where the first color filter CF1 and the second color filter CF2 contact and partially overlap each other.

The overlapping portion 120 may be defined as a region between the edges of the first color filter CF1 and the second color filter CF2 that penetrate the farthest into each other. The overlapping portion 120 may be formed not to overlap the data line DL.

The arrangement of the overlapping portion 120 not to overlap the data line DL, will hereinafter be described in further detail. The overlapping portion 120 may be disposed not to overlap the data line DL. In response to the overlapping portion 120 being formed not to overlap the data line DL, the color filter layer 300 may be formed having a gentle slope. Also, in response to the shield electrode 112 and the black matrix 115 being disposed on the color filter layer 300, the shield electrode 112 and the black matrix 115 may be formed having a gentle slope on the color filter layer 300 because the slope formed by the color filter layer 300 does not include a slope created by the thickness of the data line DL. The arrangement of the overlapping portion 120 will hereinafter be described in further detail with reference to FIG. 8 and further reference to FIG. 9.

Figure 9:
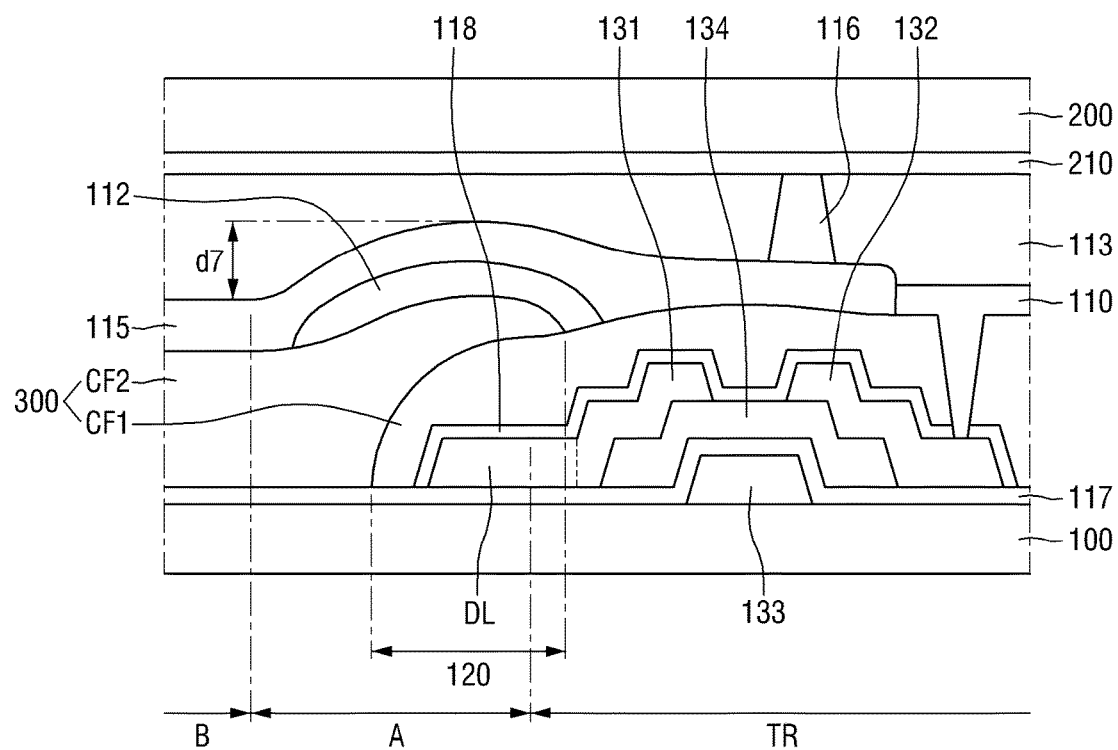
FIG. 9 is a cross-sectional view, taken long line II-II' of FIG. 4, of an array substrate according to a comparative example.

FIG. 9 is a cross-sectional view, taken long line II-II' of FIG. 4, of an array substrate according to a comparative example.

The array substrate of FIG. 9 is almost the same as the array substrate 1000 of FIG. 5, and thus will hereinafter be described, focusing mainly on differences with the array substrate 1000 of FIG. 5.

Referring to FIG. 9, an overlapping portion 120 may be formed to overlap a data line DL. In area A, a first color filter CF1 and a second color filter CF2 overlap each other, and the data line DL is disposed below a color filter layer 300. Accordingly, area A may correspond to a region where the color filter layer 300 has a slope, rather than having a uniform thickness, and area B may correspond to a region where the color filter layer 300 has a uniform thickness.

The maximum difference between the heights of the black matrix 115 in area A and area B, respectively, may be d7. On the other hand, in the array substrate 1000, the maximum difference between the heights of the black matrix 115 in area A and area B, respectively, may be d6, as illustrated in FIG. 8.

Referring to FIGS. 8 and 9, the maximum height differences d6 and d7 may differ from each other by as much as the thickness of the data line DL. That is, in the array substrate 1000 shown in FIG. 8, the overlapping portion 120 is formed not to overlap the data line DL, and thus, the color filter layer 300, the shield electrode 112 and the black matrix 115 may be prevented, or at least suppressed, from being unevenly formed due to the presence of the data line DL. The difference between the maximum height differences d6 and d7 may not necessarily be the same as the thickness of the data line DL, and may vary within a predetermined error range due to the interactions among the data line DL, the shield electrode 112 and the black matrix 115.

Characteristics of the array substrate 1000 shown in FIG. 8 as compared to the array substrate of FIG. 9 are substantially the same as those described above with reference to FIGS. 5 and 6, and thus a detailed description thereof will be omitted.

The arrangement of the black matrix 115 and the shield electrode 112 will hereinafter be described with reference to FIG. 4, which illustrates a plan view of the array substrate 1000, while avoiding redundant descriptions of parts of the array substrate 1000.

Referring back to FIG. 4, the shield electrode 112 of FIGS. 5 to 9 may be formed to overlap one of the data lines DL. The black matrix 115 of FIGS. 8 and 9 may be formed to overlap the gate lines GL and the switching elements Q. That is, there may be provided an area where only the shield electrode 112 is formed, an area where only the black matrix 115 is formed, and an area where the shield electrode 112 and the black matrix 115 are both formed to overlap each other, but the invention is not limited thereto. For example, the shield electrode 112 and the black matrix 115 may be formed to overlap each other in an entire region where the data lines DL, the gate lines GL and the switching elements Q are formed.

Figure 10:
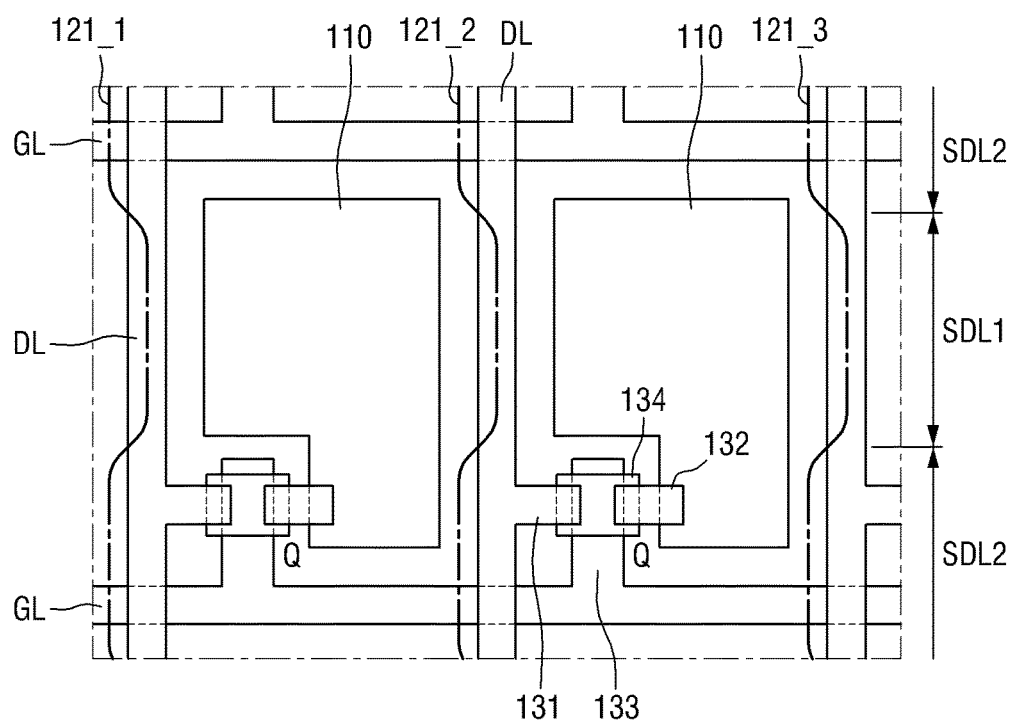
FIG. 10 is a plan view of an array substrate for a display device, according to another exemplary embodiment.

FIG. 10 is a plan view of an array substrate for a display device, according to another exemplary embodiment.

The array substrate according to another exemplary embodiment will hereinafter be described, focusing mainly on differences with its counterpart of FIG. 4.

Referring to FIG. 10, a plurality of first sub-data lines SDL1, which extend in a first direction, and a plurality of second sub-data lines SDL2, which also extend in the first direction, may be provided. The first sub-data lines SDL1 and the second sub-data lines SDL2 may be alternately arranged so as to form a plurality of data lines DL. For convenience, only one data line DL on the far right of FIG. 10 is illustrated as being divided into the first sub-data lines SDL1 and the second sub-data lines SDL2, but other data lines DL may also be divided into a plurality of first sub-data lines SDL1 and a plurality of second sub-data lines SDL2.

In FIG. 10, dashed center lines 121_1, 121_2 and 121_3 may be the center lines of overlapped portions (not illustrated), respectively. A color filter layer (not illustrated) including a plurality of color filters may be formed on the data lines DL, a plurality of gate lines GL, a plurality of pixel electrodes 110 and a plurality of switching elements Q, and the overlapping portions may be formed on the edges of the plurality of color filters. The center lines 121_1, 121_2 and 121_3 of the overlapping portions may be lines that connect the centers of the overlapping portions.

More specifically, the first sub-data lines SDL1 may be formed to overlap the center lines 121_1, 121_2 and 121_3, and the second sub-data lines SDL2 may be formed not to overlap the center lines 121_1, 121_2 and 121_3.

The arrangement of the first sub-data lines SDL1 and the second sub-data lines SDL2 may be determined by differences in thickness between various elements formed between the first sub-data lines SDL1 and a liquid crystal layer and various elements formed between the second sub-data lines SDL1 and the liquid crystal layer. More specifically, as already discussed above with reference to FIGS. 5 to 9, only shield electrodes 112 may be provided between the first sub-data lines SDL1 and the liquid crystal layer, whereas both the shield electrodes and the black matrix 115 may both be formed between the second sub-data lines SDL2 and the liquid crystal layer. Accordingly, the color filter layer may be formed with a gentler slope over the second sub-data lines SDL2 than over the first sub-data lines SDL1.

The arrangement and the shape of the plurality of color filters of the color filter layer are not limited to those illustrated in FIG. 10. That is, the plurality of color filters of the color filter layer may be formed in various arrangements and shapes. Also, the center lines 121_1, 121_2 and 121_3 may be formed in a vertical direction, as illustrated in FIG. 10. Alternatively, the center lines 121_1, 121_2 and 121_3 may be formed in a horizontal direction or in both the vertical and horizontal directions. Also, the center lines 121_1, 121_2 and 121_3 may be formed in various shapes, other than that illustrated in FIG. 10.

Figure 11:
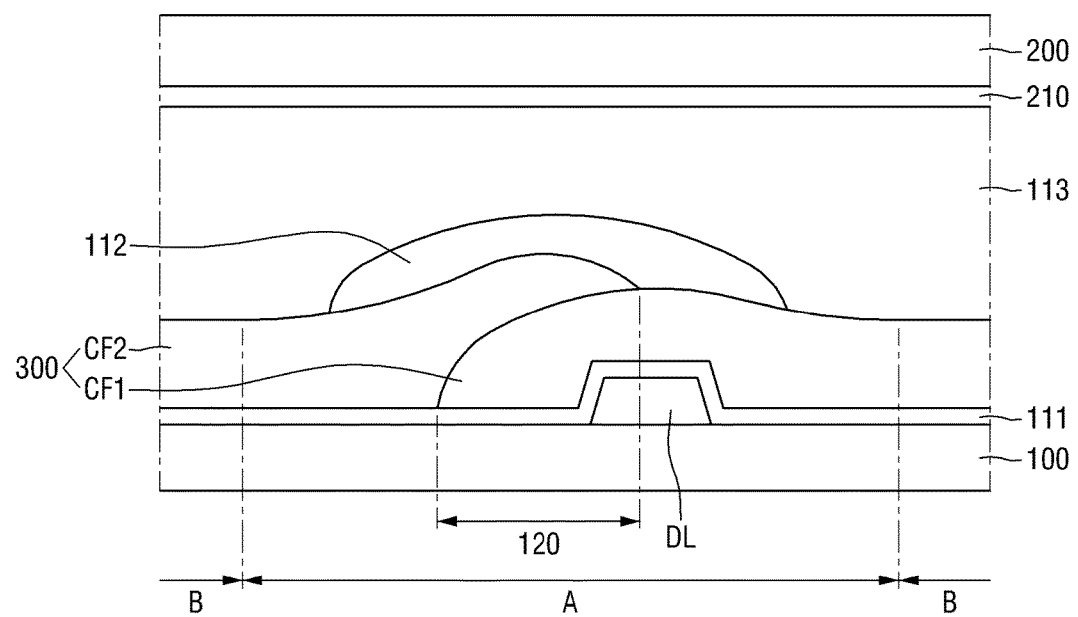
FIG. 11 is a cross-sectional view, taken along line I-I' of FIG. 4, of an array substrate according to another exemplary embodiment.

FIG. 11 is a cross-sectional view of the array substrate according to another exemplary embodiment.

More specifically, FIG. 11 illustrates a cross-sectional view, taken along line I-I' of FIG. 4, of the array substrate according to another exemplary embodiment. The array substrate of FIG. 11 will hereinafter be described, focusing mainly on differences with the array substrate 1000 of FIG. 5.

Referring to FIG. 11, an overlapping portion 120 may be disposed to overlap part of a data line DL. In this exemplary embodiment, a color filter layer 300 and a shield electrode 112 may not be formed with as gentle a slope as that of the color filter layer 300 and the shield electrode 112 of FIG. 5, but the areas of the overlapping portion 120, the data line DL and the shield electrode 112 in the array substrate according to another exemplary embodiment of the invention may be relatively reduced.

That is, by forming the overlapping portion 120 to overlap part of the data line DL, the widths of the overlapping portion 120, the data line DL, and the shield electrode 112 may be relatively reduced. Accordingly, the aperture ratio of the array substrate according to the exemplary embodiment shown in FIG. 11 may be relatively improved, and thus, a flexible design of the array substrate according to according to the exemplary embodiment shown in FIG. 11 *n* may be achieved.

According to the exemplary embodiments, it is possible to improve the liquid crystal margin of an array substrate for a display device. That is, it is possible to provide an array substrate for a display device, which is capable of facilitating the injection of a liquid crystal material and improving the uniformity of the spread of the liquid crystal material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate for a display device, comprising:
    a substrate;
    a signal line disposed on the substrate;
    a first color filter disposed at least partially on a first side of the signal line;
    a second color filter disposed at least partially on a second side of the signal line, the second side being opposite the first side;
    an overlapping portion in which a portion of the first color filter and a portion of the second color filter overlap; and
    a shield electrode disposed on the first color filter and the second color filter,
    wherein:
    the first color filter extends to overlap the signal line and the overlapping portion is disposed on the second side of the signal line so as not to overlap the signal line; and
    the shield electrode overlaps the signal line.

2. The array substrate of claim 1, wherein the signal line comprises one of a data line disposed on the substrate and extending in a first direction, and a gate line disposed on the substrate and extending in a second direction.

3. The array substrate of claim 1, wherein the overlapping portion comprises a region where the first color filter penetrates a lower portion of the second color filter or the second color filter penetrates a lower portion of the first color filter.

4. The array substrate of claim 1, wherein the shield electrode overlaps the overlapping portion.

5. The array substrate of claim 1, further comprising:
    a common electrode disposed on the shield electrode and configured to be provided with a voltage,
    wherein the shield electrode is configured to be provided with the same voltage as the common electrode.

6. The array substrate of claim 1, further comprising:
    a black matrix disposed on the first color filter and the second color filter,
    wherein the black matrix overlaps the signal line.

7. The array substrate of claim 6, wherein the black matrix overlaps the overlapping portion.

8. The array substrate of claim 6, wherein the black matrix comprises a protrusion protruding in a direction in which the signal line is aligned.

9. The array substrate of claim 1, wherein the first color filter is configured to transmit light with a different peak wavelength than the peak wavelength of light configured to be transmitted by the second color filter.

* * * * *